United States Patent
Fujikawa et al.

(10) Patent No.: US 7,560,901 B2
(45) Date of Patent: Jul. 14, 2009

(54) INTERNAL SHORT DETECTION APPARATUS FOR SECONDARY-BATTERY, INTERNAL SHORT DETECTION METHOD FOR SECONDARY-BATTERY, BATTERY-PACK, AND ELECTRONIC EQUIPMENT

(75) Inventors: Masato Fujikawa, Moriguchi (JP); Masaru Kawabe, Suita (JP); Mikinari Shimada, Yawata (JP)

(73) Assignee: Panasonic Corporation, Osaka (JP)

( * ) Notice: Subject to any disclaimer, the term of this patent is extended or adjusted under 35 U.S.C. 154(b) by 403 days.

(21) Appl. No.: 11/354,935

(22) Filed: Feb. 16, 2006

(65) Prior Publication Data

US 2006/0186859 A1    Aug. 24, 2006

(30) Foreign Application Priority Data

Feb. 18, 2005 (JP) ............................. 2005-041980
Feb. 1, 2006 (JP) ............................. 2006-024299

(51) Int. Cl.
*H02J 7/00* (2006.01)
*G01N 27/416* (2006.01)

(52) U.S. Cl. ...................................... 320/134; 324/434
(58) Field of Classification Search ................ 320/134, 320/136; 324/426, 430, 433, 434
See application file for complete search history.

(56) References Cited

U.S. PATENT DOCUMENTS 5,945,805 A    8/1999  Takei et al.
6,255,803 B1 *  7/2001  Ishihara et al. ............... 320/134

FOREIGN PATENT DOCUMENTS

| CN | 1174441 A | 2/1998 |
| JP | 2002-50410 | 2/2002 |
| JP | 2003-9405 | 1/2003 |

OTHER PUBLICATIONS

Chinese Office Action issued in Chinese Patent Application No. Cn 2006100088272 dated Mar. 20, 2009.

* cited by examiner

*Primary Examiner*—Akm E Ullah
*Assistant Examiner*—Jue Zhang
(74) *Attorney, Agent, or Firm*—McDermott Will & Emery LLP

(57) ABSTRACT

A secondary-battery internal short detection apparatus is provided which is capable of precisely detecting an internal short being generated in a secondary-battery. In this apparatus: an electricity-quantity storage circuit stores in advance a reference electricity-quantity necessary for charging the secondary-battery from a first voltage to a second voltage; an electricity-quantity accumulation circuit measures an accumulative electricity-quantity necessary for charging the secondary-battery from the first voltage to the second voltage; and an internal short detection circuit compares the accumulative electricity-quantity measured by the electricity-quantity accumulation circuit and the reference electricity-quantity stored in the electricity-quantity storage circuit, if the accumulative electricity-quantity is larger than the reference electricity-quantity, then decides that an internal short is generated, and if the accumulative electricity-quantity is equal to, or smaller than, the reference electricity-quantity, then without deciding that an internal short is generated, rewrites the reference electricity-quantity stored in the electricity-quantity storage circuit into the accumulative electricity-quantity.

11 Claims, 7 Drawing Sheets

INTERNAL SHORT DETECTION APPARATUS FOR SECONDARY-BATTERY, INTERNAL SHORT DETECTION METHOD FOR SECONDARY-BATTERY, BATTERY-PACK, AND ELECTRONIC EQUIPMENT

BACKGROUND OF THE INVENTION

1. Field of the Invention

The present invention relates to a secondary-battery internal short detection apparatus which detects an internal short being generated in a secondary-battery. It also relates, for the same purpose, to a secondary-battery internal short detection method, a battery-pack and electronic equipment.

2. Description of the Background Art

In a chemical battery such as a lithium-ion secondary-battery, a separator is provided which insulates each plate electrically between a positive electrode and a negative electrode. It also has the function of holding an electrolyte solution.

The difference in energy between the positive electrode and the negative electrode is naturally extracted to the outside as electrical energy. However, it is radiated to the outside as heat if the mixture of foreign matter or the like generates a short-circuit between the positive and negative electrodes. This short-circuit heat can heat the battery. Besides, once a short-circuit is produced, the generated heat may melt the separator. In the following cycles, the electrode plate is expanded and shrunk, or it is subjected to another such change. This can produce a short-circuit repeatedly, thus heating the battery further. Therefore, it is desirable that the fact that an internal short is generated in the battery be precisely detected. Then, if the internal short is generated, a processing should be executed for stopping using it or doing another such.

Conventionally, as the art of detecting an internal short, a power-source apparatus provided with a battery-abnormality decision apparatus is proposed which detects an instantaneous voltage drop when a short-circuit of positive and negative electrodes is produced in a lithium-ion battery (e.g., refer to Japanese Patent Laid-Open No. 2003-9405 specification). Or, a secondary-battery short-circuit detection method is suggested which detects a short-circuit being generated if a rise in the voltage at a charge time is below normal secondary-battery data acquired beforehand (e.g., refer to Japanese Patent Laid-Open No. 2002-50410 specification).

However, in terms of a notebook PC (or personal computer) or a cellular phone in which a secondary-battery is frequently used as its power-source, such equipment is often operated through a pulse charge and discharge for a short time. Hence, even in an ordinary secondary-battery, the voltage fluctuates at short time intervals. In addition, the period of time when a short-circuit is generated, or the depth of a drop in the voltage, varies. Accordingly, in the above described method of detecting an instantaneous voltage drop, only a drop in the voltage caused by a short-circuit is hard to distinguish. This may cause a false detection. Besides, in the above described method of making a comparison using ordinary secondary-battery data acquired in advance, a mass of data needs to be acquired according to changes in an electric current or temperature.

SUMMARY OF THE INVENTION

In order to resolve the above described disadvantages, it is an object of the present invention to provide a secondary-battery internal short detection apparatus, a secondary-battery internal short detection method, a battery-pack and electronic equipment which are capable of precisely detecting an internal short being generated in a secondary-battery.

Specifically, a secondary-battery internal short detection apparatus according to an aspect of the present invention which detects an internal short in a secondary-battery, comprising: an electricity-quantity storage circuit which stores a reference electricity-quantity necessary for charging the secondary-battery from a first voltage to a second voltage higher than the first voltage; an electricity-quantity accumulation circuit which measures an accumulative electricity-quantity necessary for charging the secondary-battery from the first voltage to the second voltage; and an internal short detection circuit which compares the accumulative electricity-quantity measured by the electricity-quantity accumulation circuit and the reference electricity-quantity stored in the electricity-quantity storage circuit, if the accumulative electricity-quantity is larger than the reference electricity-quantity, then decides that an internal short is generated, and if the accumulative electricity-quantity is equal to, or smaller than, the reference electricity-quantity, then decides that an internal short is not generated and rewrites the reference electricity-quantity stored in the electricity-quantity storage circuit into the accumulative electricity-quantity.

A secondary-battery internal short detection method according to another aspect of the present invention for detecting an internal short in a secondary-battery, comprising: an electricity-quantity accumulating step of measuring an accumulative electricity-quantity necessary for charging the secondary-battery from a first voltage to a second voltage higher than the first voltage; an electricity-quantity comparing step of comparing the accumulative electricity-quantity measured in the electricity-quantity accumulating step and a reference electricity-quantity which is stored in advance in an electricity-quantity storage circuit and is necessary for charging the secondary-battery from the first voltage to the second voltage; an internal short detecting step of deciding that an internal short is generated, if the accumulative electricity-quantity is larger than the reference electricity-quantity in the electricity-quantity comparing step; and a reference electricity-quantity rewriting step of deciding that an internal short is not generated and rewriting the reference electricity-quantity stored in the electricity-quantity storage circuit into the accumulative electricity-quantity, if the accumulative electricity-quantity is equal to, or smaller than, the reference electricity-quantity in the electricity-quantity comparing step.

According to these configurations, a reference electricity-quantity necessary for charging the secondary-battery from a first voltage to a second voltage is stored in an electricity-quantity storage circuit. Then, an accumulative electricity-quantity is measured which is necessary for charging the secondary-battery from the first voltage to the second voltage. Sequentially, a comparison is made between the measured accumulative electricity-quantity and the reference electricity-quantity stored in the electricity-quantity storage circuit. If the accumulative electricity-quantity is larger than the reference electricity-quantity, the decision is made that an internal short is generated. On the other hand, if the accumulative electricity-quantity is equal to, or smaller than, the reference electricity-quantity, the decision is made that an internal short is not generated. Then, the reference electricity-quantity stored in the electricity-quantity storage circuit is rewritten into the accumulative electricity-quantity.

Therefore, a comparison is made between the measured accumulative electricity-quantity and the reference electricity-quantity stored in the electricity-quantity storage circuit, and if the accumulative electricity-quantity is larger than the reference electricity-quantity, the decision is made that an internal short is generated. This makes it possible to precisely detecting an internal short being generated in the secondary-battery. Further, even if no internal short is generated, the electricity-quantity varies which is required for charging when the secondary-battery degrades. However, if the decision is made that no internal short is generated, the reference electricity-quantity stored so far is rewritten to the electricity-quantity at the charge time used when this decision is made. This helps improve the precision of a detection. Still further, using an electricity-quantity at a charge time in one and the same secondary-battery, a decision is made whether an internal short is generated. Thus, the difference between secondary batteries to be compared can be prevented from producing some effect. This helps certainly detect an internal short being generated.

A battery-pack according to still another aspect of the present invention, comprising: a secondary-battery; a voltage detection circuit which detects a voltage up to which the secondary-battery is charged; a current detection circuit which detects an electric current which passes through the secondary-battery; the above described internal short detection apparatus; a battery-pack switch which turns on and off the power supplied to the outside from the secondary-battery; and a battery-pack switch control circuit which receives an internal short signal outputted when the internal short detection apparatus decides that an internal short is generated, and turns off the battery-pack switch.

According to this configuration, a voltage detection circuit detects a voltage up to which the secondary-battery is charged, and a current detection circuit detects an electric current which flows through the secondary-battery. Then, an internal short signal is received which is outputted when the internal short detection apparatus decides that an internal short is generated. Sequentially, the battery-pack switch is turned off which turns on and off the power supplied to the outside from the secondary-battery.

Therefore, the secondary-battery in which an internal short is generated can be properly controlled. Hence, after the internal short has been generated, the secondary-battery can be prevented from continuing to be used. This helps keep an internal short from being repeatedly produced and hinder the secondary-battery from being heated. This makes the battery-pack safer.

Electronic equipment according to still another aspect of the present invention in which the above described battery-pack is used as a power-source, comprising: a battery charger which charges a secondary-battery provided in the battery-pack; an alarming means; and an alarm control circuit which receives a signal indicating an internal short which is outputted from the battery-pack, and allows the alarming means to warn that the internal short is generated.

According to this configuration, a battery charger charges a secondary-battery provided in the battery-pack. Then, a signal indicating an internal short is received which is outputted from the battery-pack, and the alarming means warns that the internal short is generated. Therefore, a user can become accurately aware that a secondary-battery is abnormal. This makes it possible to execute an appropriate processing such as the backup of data.

Electronic equipment according to still another aspect of the present invention in which the above described battery-pack is used as a power-source, comprising: a battery charger which charges a secondary-battery provided in the battery-pack; a load section to which the power is supplied from the secondary-battery; an electronic-equipment switch which turns on and off the power supplied to the load section from the secondary-battery; and an electronic-equipment switch control circuit which receives a signal indicating an internal short which is outputted from the battery-pack, and turns off the electronic-equipment switch.

According to this configuration, a signal indicating an internal short is received which is outputted from the battery-pack, and an electronic-equipment switch is turned off which turns on and off the power supplied to the load section from the secondary-battery. Therefore, after an internal short is produced, the secondary-battery can be prevented from continuing to be used as the electronic equipment's power-source. This makes the electronic equipment safer.

DESCRIPTION OF THE PREFERRED EMBODIMENTS

Hereinafter, embodiments of the present invention will be described with reference to the attached drawings. Incidentally, the present invention is not limited to the following embodiments.

Figure 1:
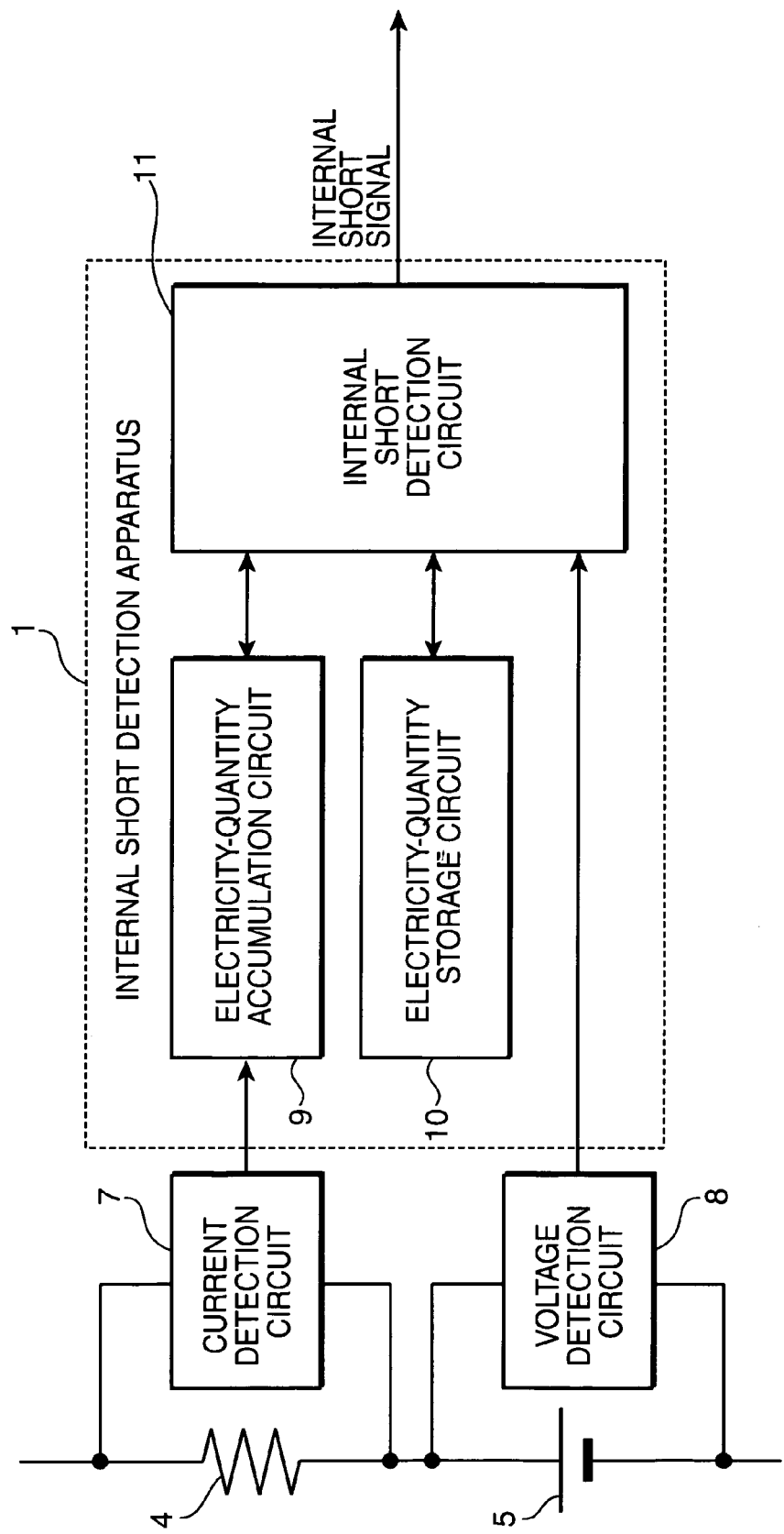
FIG. 1 is a circuit diagram, showing the electrical configuration of an internal short detection apparatus which detects an internal short being generated in a secondary-battery according to the present invention.

FIG. 1 is a circuit diagram, showing the electrical configuration of an internal short detection apparatus which detects an internal short being generated in a secondary-battery according to the present invention. An internal short detection apparatus 1 includes: an electricity-quantity accumulation circuit 9 which receives a signal from a current detection circuit 7 which detects an electric current passing through a secondary-battery 5, and accumulates the quantity of electricity; an electricity-quantity storage circuit 10 which stores the quantity of electricity between specific voltages; and an internal short detection circuit 11 which decides whether an internal short (i.e. internal short-circuit) is generated, based on a signal from a voltage detection circuit 8 which detects the voltage of the secondary-battery 5 and a signal from the electricity-quantity accumulation circuit 9.

The electricity-quantity accumulation circuit 9 measures an accumulative electricity-quantity (hereinafter, also referred to as a measured electricity-quantity) required for charging the secondary-battery 5 from a first voltage to a second voltage higher than the first voltage. The electricity-quantity storage circuit 10 stores a reference electricity-quantity required for charging the secondary-battery 5 from the first voltage to the second voltage.

The internal short detection circuit 11 compares the accumulative electricity-quantity measured by the electricity-quantity accumulation circuit 9 and the reference electricity-quantity stored in the electricity-quantity storage circuit 10. Then, if the accumulative electricity-quantity is larger than the reference electricity-quantity, it decides that an internal short is generated. On the other hand, if the accumulative electricity-quantity is equal to, or smaller than, the reference electricity-quantity, it does not decide that an internal short is generated. Then, it rewrites the reference electricity-quantity stored in the electricity-quantity storage circuit 10, so that it becomes the accumulative electricity-quantity.

Figure 2:
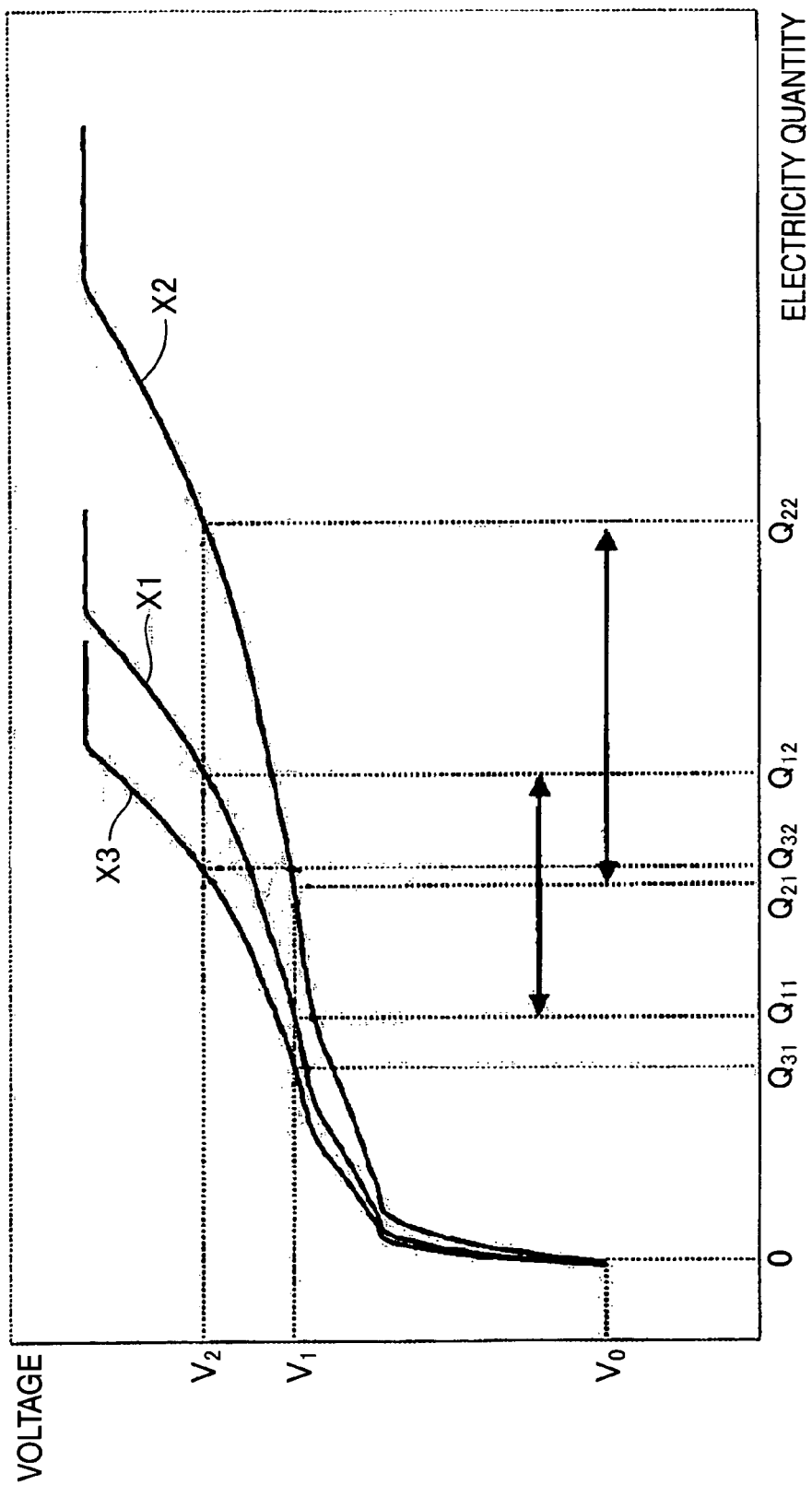
FIG. 2 is a graphical representation, showing a secondary-battery internal short detection method according to the present invention.

Herein, a secondary-battery internal short detection method according to the present invention will be described. FIG. 2 is a graphical representation, showing the secondary-battery internal short detection method according to the present invention. FIG. 2 shows a curved line X1 which indicates the correlation between an electricity-quantity and a voltage when a normal secondary-battery is charged; a curved line X2 which indicates the correlation between an electricity-quantity and a voltage when a secondary-battery subjected to an internal short is charged; and a curved line X3 which indicates the correlation between an electricity-quantity and a voltage when a normal secondary-battery is charged after degraded. Herein, the degraded normal secondary-battery is equivalent to a normal secondary-battery whose discharge capacity is reduced or internal resistance is raised. This time, in a lithium-ion secondary-battery, the electricity-quantity-voltage curves are shown at the time when a constant-voltage charge (or CV charge) is executed after a constant-current charge (or CC charge). However, in the same way, the present invention can also be applied to a different secondary-battery (such as a nickel-hydrogen storage battery and a nickel-cadmium storage battery), or a different charging system.

In FIG. 2, an electricity-quantity Q11 and an electricity-quantity Q12 expresses an electricity-quantity needed for charging the normal secondary-battery from a voltage V0 to a voltage V1 and a voltage V2, respectively. An electricity-quantity Q21 and an electricity-quantity Q22 expresses an electricity-quantity needed for charging the secondary-battery which has undergone an internal short from the voltage V0 to the voltage V1 and the voltage V2, respectively. An electricity-quantity Q31 and an electricity-quantity Q32 expresses an electricity-quantity needed for charging the degraded normal secondary-battery from the voltage V0 to the voltage V1 and the voltage V2, respectively.

The secondary-battery subjected to an internal short gives off electrical energy through a self-discharge. Hence, its voltage becomes lower than that of the normal secondary-battery, if both are given an equivalent electricity-quantity. This increases the electricity-quantity necessary for charging it fully. Besides, if the normal secondary-battery is degraded, the secondary-battery's internal resistance becomes greater. Hence, its voltage becomes higher than before it is degraded, if both are given an equivalent electricity-quantity. This decreases the electricity-quantity necessary for charging it fully.

Herein, the electricity-quantity required for charging each secondary-battery from the voltage V1 to the voltage V2 is "Q12−Q11", "Q22−Q21" and "Q32−Q31" in the normal secondary-battery, the secondary-battery subjected to an internal short and the normal secondary-battery after degraded, respectively. They satisfy the relation of Q22−Q21>Q12−Q11>Q32−Q31.

Specifically, in the case of the normal secondary-battery, the secondary-battery is degraded as charge and discharge cycles are executed. Thus, the electricity-quantity needed for charging the battery from the voltage V1 to the voltage V2 becomes smaller than the electricity-quantity spent on charging the normal secondary-battery from the voltage V1 to the voltage V2. However, only in the case of the secondary-battery which has undergone an internal short, the electricity-quantity necessary for charging the secondary-battery from the voltage V1 to the voltage V2 becomes larger than the electricity-quantity spent on charging the normal secondary-battery from the voltage V1 to the voltage V2.

In this way, electricity quantities for charging are compared, so that a secondary-battery in which an internal short is generated can be precisely detected. This makes it possible to exchange the secondary-battery subjected to this detected internal short for a normal secondary-battery.

Herein, an operation will be described about the internal short detection apparatus 1 shown in FIG. 1. First, at a charge time, the internal short detection circuit 11 receives a signal from the voltage detection circuit 8 at intervals of 10-ms. If this voltage is 3.5 V, it sends the signal to the electricity-quantity accumulation circuit 9. Receiving this signal, the electricity-quantity accumulation circuit 9 calculates an electricity-quantity based on the product of a current-value signal and a time which are sent at 10-ms intervals from the current detection circuit 7. Then, it adds up these electricity-quantity values. Next, if a voltage value sent from the voltage detection circuit 8 is 4.0 V, the internal short detection circuit 11 sends a signal to the electricity-quantity accumulation circuit 9. The electricity-quantity accumulation circuit 9 receives this signal and finishes totaling up electricity quantities. Then, it sends such an electricity-quantity Q1 to the internal short detection circuit 11. The internal short detection circuit 11 compares this electricity-quantity Q1 and an electricity-quantity Q0 stored in the electricity-quantity storage circuit 10. If Q1 is larger than Q0, it decides that an internal short is generated in the secondary-battery 5 which is a subject of detection. On the other hand, if Q1 is equal to, or smaller than, Q0, it decides that an internal short is not generated in the targeted secondary-battery 5. Then, it rewrites the value of Q1 freshly as the value of Q0.

Figure 3:
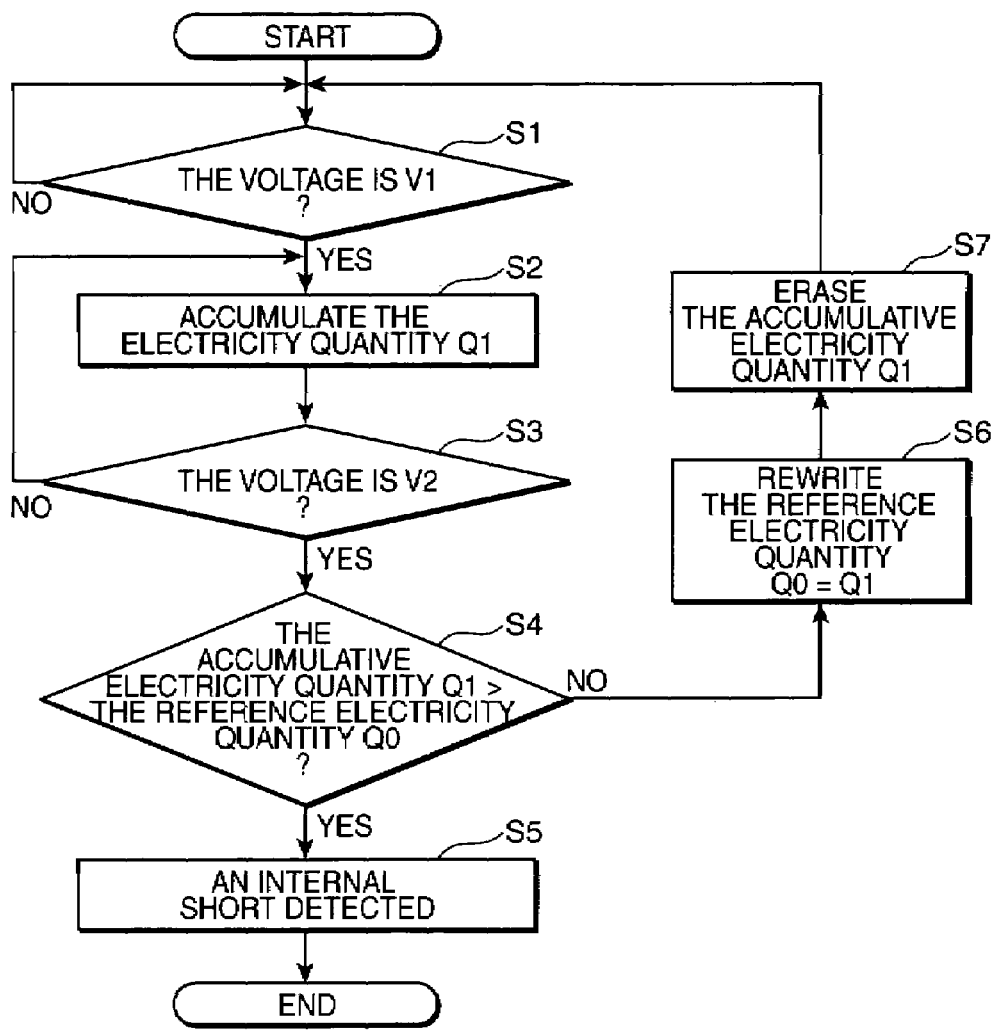
FIG. 3 is a flow chart, showing how the internal short detection apparatus 1 shown in FIG. 1 detects an internal short being generated in the secondary-battery.

Next, a flow will be described about how the internal short detection apparatus 1 shown in FIG. 1 detects an internal short being generated in a secondary-battery. FIG. 3 is a flow chart, showing how the internal short detection apparatus 1 shown in FIG. 1 detects an internal short being generated in the secondary-battery.

First, in a step S1, the internal short detection circuit 11 decides whether the voltage is the predetermined voltage V1. If it decides that the voltage is V1 (YES at the step S1), it instructs the electricity-quantity accumulation circuit 9 to start accumulating electricity quantities. Then, the processing goes to a step S2. In contrast, if it decides that it is not V1 (NO at the step S1), it repeats a decision in the step S1. Sequentially, in a step S2, the electricity-quantity accumulation circuit 9 begins to accumulate electricity quantities from the point of time when the voltage has become V1.

Next, in a step S3, the internal short detection circuit 11 decides whether the voltage is the predetermined voltage V2. If it decides that the voltage is V2 (YES at the step S3), it instructs the electricity-quantity accumulation circuit 9 to finish accumulating electricity quantities. Then, it acquires the accumulative electricity-quantity Q1 from the electricity-quantity accumulation circuit 9, and the processing moves to a step S4. This acquired accumulative electricity-quantity Q1 is stored in an internal memory provided in the internal short detection circuit 11. In contrast, if it decides that it is not V2

(NO at the step S3), it repeats the accumulation of electricity quantities in the step S2 and the decision of a voltage in the step S3.

Sequentially, in a step S4, the internal short detection circuit 11 compares the electricity-quantity (i.e., accumulative electricity-quantity) Q1 spent on charging the battery from V1 to V2 and the electricity-quantity (i.e., reference electricity-quantity) Q0 for a normal secondary-battery stored in the electricity-quantity storage circuit 10. If the decision is made that the electricity-quantity Q1 is greater than the electricity-quantity Q0 for a normal secondary-battery (YES at the step S4), the processing goes forward to a step S5. On the other hand, if the decision is made that the electricity-quantity Q1 is equal to the electricity-quantity Q0, or if the decision is made that the electricity-quantity Q1 is smaller than the electricity-quantity Q0 (NO at the step S4), the processing proceeds to a step S6.

If the processing moves a head to the step S5, the internal short detection circuit 11 decides that an internal short is generated in the secondary-battery. Then, it outputs, to the outside, an internal short signal for notifying external equipment that the internal short is generated. In contrast, if the processing moves ahead to the step S6, the internal short detection circuit 11 decides that the secondary-battery is normal. Then, it rewrites the value stored in the electricity-quantity storage circuit 10 into the electricity-quantity at this time. Next, in a step S7, the internal short detection circuit 11 erases the accumulative electricity-quantity Q1. Thereafter, it shifts to the step S1 and repeats the processing.

As described above, an electricity-quantity is stored each time. Thereby, even if the electricity-quantity fluctuates as a secondary-battery is used, its effect can be reduced. This makes it possible to precisely detect an internal short being generated in the secondary-battery.

Next, an experimental example will be described of an internal short detection processing in the internal short detection apparatus 1 according to this embodiment. In the following experimental example, a 18650 battery which has a manufacturer-specified capacity of 2000 mAh is used as a subject of detection. In this battery, charge and discharge cycles are executed under the conditions mentioned below.

(1) Constant-current charge: 1400 mA (Terminal voltage 4.2 V)

(2) Constant-voltage charge: 4.2 V (Terminal current 100 mA)

(3) Constant-current discharge: 2000 mA (Terminal voltage 3 V)

First, the electricity-quantity spent on charging the battery from 3.5 V to 4.0 V is measured for each charge and discharge cycle. Herein, the battery's manufacturer-specified capacity 2000 mAh is used as the reference electricity-quantity Q0. At the initial charge time, the measured electricity-quantity Q1 spent on charging the battery from 3.5 V to 4.0 V is 1200 mAh. This result suggests that the measured electricity-quantity Q1 (1200 mAh) is smaller than the reference electricity-quantity Q0 (2000 mAh). Hence, the decision is made that an internal short is not generated, and thus, the reference electricity-quantity Q0 is newly set at 1200 mAh.

This series of operations is repeated for each charge and discharge cycle, so that a decision is made whether or not an internal short is generated in the secondary-battery. Table 1 shows the number of charge and discharge cycles, the reference electricity-quantity Q0, the measured electricity-quantity Q1 and the result of a decision on whether an internal short is generated.

TABLE 1

| CYCLE NUMBER | REFERENCE ELECTRICITY QUANTITY Q0 (mAh) | MEASURED ELECTRICITY QUANTITY Q1 (mAh) | INTERNAL SHORT DECISION |
|---|---|---|---|
| 1 | 2000 | 1200 | OK |
| 2 | 1200 | 1198 | OK |
| 3 | 1198 | 1197 | OK |
| ... | ... | ... | ... |
| 623 | 384 | 384 | OK |
| 624 | 384 | 382 | OK |
| 625 | 382 | 425 | NG |

In Table 1, from the first cycle to the 624-th cycle, the measured electricity-quantity Q1 is equal to, or smaller than, the reference electricity-quantity Q0. In contrast, the measured electricity-quantity Q1 (425 mAh) in the 625-th cycle is larger, by 3 percent or over, than the reference electricity-quantity Q0 (382 mAh). Thus, the decision is made that an internal short is generated.

Furthermore, in order to verify the above described decision result, the secondary-battery is disassembled after the internal short has been detected. As a result, a confirmation is obtained where the internal short has actually been produced in the secondary-battery. Thereby, this decision result is proved to be correct. As described so far, using the internal short detection method according to the present invention, an internal short can be detected extremely simply and precisely.

Next, a comparative example will be described of an internal short detection processing in the internal short detection apparatus 1 according to this embodiment. In the comparative example, in the same way as the embodiment, a 18650 battery which has a manufacturer-specified capacity of 2000 mAh is used as a subject of detection. First, a normal secondary-battery with ten cells before degraded is charged in advance at a constant current of 1400 mAh. Then, an electricity-quantity necessary for charging each cell from 3.5 V to 4.0 V is calculated. The average value of these electricity quantities for the ten cells is calculated, and as a result, it is 1230 mAh. This value is set as the reference electricity-quantity Q0 of the normal secondary-battery.

Sequentially, in a battery to be detected, charge and discharge cycles are executed under the same conditions as the embodiment. First, the measured electricity-quantity Q1 spent on charging the battery from 3.5 V to 4.0 V is measured for each charge and discharge cycle. Then, this measured electricity-quantity Q1 is compared with the reference electricity-quantity Q0. At the initial charge time, the measured electricity-quantity Q1 is 1200 mAh. This result suggests that the measured electricity-quantity Q1 (1200 mAh) is smaller than the reference electricity-quantity Q0 (1230 mAh). Hence, the decision is made that an internal short is not generated.

This series of operations is repeated for each charge and discharge cycle. Without updating the reference electricity-quantity Q0 for each charge and discharge cycle, a decision is made whether or not an internal short is generated in the secondary-battery. Table 2 shows the number of charge and discharge cycles, the reference electricity-quantity Q0, the measured electricity-quantity Q1 and the result of a decision on whether an internal short is generated.

TABLE 2

| CYCLE NUMBER | REFERENCE ELECTRICITY QUANTITY Q0 (mAh) | MEASURED ELECTRICITY QUANTITY Q1 (mAh) | INTERNAL SHORT DECISION |
| --- | --- | --- | --- |
| 1 | 1230 | 1200 | OK |
| 2 | 1230 | 1198 | OK |
| 3 | 1230 | 1197 | OK |
| ... | ... | ... | ... |
| 568 | 1230 | 417 | OK |
| 569 | 1230 | 415 | OK |
| 570 | 1230 | 458 | OK |

In Table 2, from the first cycle to the 569-th cycle, the measured electricity-quantity Q1 is smaller than the reference electricity-quantity Q0. Thus, the decision is made that an internal short is not generated. Sequentially, even in the 570-th cycle, the measured electricity-quantity Q1 (458 mAh) is also smaller than the reference electricity-quantity Q0 (1230 mAh). Hence, the decision is made that an internal short is not generated. However, the measured electricity-quantity Q1 (458 mAh) in the 570-th cycle is larger than the measured electricity-quantity Q1 (415 mAh) in the 569-th cycle. Paying attention to this fact, the secondary-battery is disassembled. As a result, the verification is obtained that an internal short is actually generated.

This is because, even in a secondary-battery where no internal short is generated, repeated charge and discharge cycles can cause the secondary-battery degradation, thereby reducing the electricity-quantity at the charge time. Consequently, the reference electricity-quantity Q0 is apart from the measured electricity-quantity Q1.

As described above, an electricity-quantity is stored beforehand for a secondary-battery which is a subject of detection. Then, a comparison is made with this electricity-quantity, so that a decision can be made whether an internal short is generated. Besides, the electricity-quantity to be stored is rewritten. This makes it possible to detect an internal short extremely simply and precisely.

In this way, the reference electricity-quantity Q0 necessary for charging the secondary-battery 5 from the first voltage V1 to the second voltage V2 is stored in the electricity-quantity storage circuit 10. Then, the accumulative electricity-quantity Q1 is measured which is necessary for charging the secondary-battery 5 from the first voltage V1 to the second voltage V2. Sequentially, a comparison is made between the measured accumulative electricity-quantity Q1 and the reference electricity-quantity Q0 stored in the electricity-quantity storage circuit 10. If the accumulative electricity-quantity Q1 is larger than the reference electricity-quantity Q0, the decision is made that an internal short is generated. On the other hand, if the accumulative electricity-quantity Q1 is equal to, or smaller than, the reference electricity-quantity Q0, the decision is made that an internal short is not generated. Then, the reference electricity-quantity Q0 stored in the electricity-quantity storage circuit 10 is rewritten into the accumulative electricity-quantity Q1.

If an internal short is produced in the secondary-battery 5, the energy kept in the secondary-battery 5 is emitted outside as heat and disappears. Therefore, the electricity-quantity required for charging the secondary-battery 5 becomes larger than in the case where an internal short is not produced.

By the way, a reduction in the discharge electricity-quantity or a drop in the discharge voltage which may be caused by an internal short can occur, even when the secondary-battery 5 is degraded as charge and discharge cycles are repeated at a normal time. Hence, an error can be made in detection. On the other hand, an increase in the electricity-quantity of a charge at the time of charge and discharge cycles cannot take place when the normal secondary-battery 5 is used in a normal environment.

Therefore, a comparison is made between the measured accumulative electricity-quantity Q1 and the reference electricity-quantity Q0 stored in the electricity-quantity storage circuit 10, and if the accumulative electricity-quantity Q1 is larger than the reference electricity-quantity Q0, the decision is made that an internal short is generated. This makes it possible to precisely detecting an internal short being generated in the secondary-battery 5. Further, even if no internal short is generated, the electricity-quantity varies which is required for charging when the secondary-battery 5 degrades. However, if the decision is made that no internal short is generated, the reference electricity-quantity. Q0 stored so far is rewritten to the electricity-quantity Q1 at the charge time used when this decision is made. This helps improve the precision of a detection. Still further, using an electricity-quantity at a charge time in one and the same secondary-battery 5, a decision is made whether an internal short is generated. Thus, the difference between secondary batteries to be compared can be prevented from producing some effect. This helps certainly detect an internal short being generated.

Incidentally, the internal short detection circuit 11 according to this embodiment decides that an internal short is produced, if the accumulative electricity-quantity Q1 is larger, by 3 percent or over, than the reference electricity-quantity Q0. However, the present invention is not limited especially to this. If it is below 3 percent, an error may be made in measuring an electricity-quantity, thereby detecting an internal short by mistake. On the other hand, if it is above 15 percent, the secondary-battery is conspicuously deteriorated before an internal short is detected.

For example, in the case of a lithium-ion secondary-battery, when the electricity-quantity varies by 15 percent in the last stage of a charge, the voltage changes by approximately 0.2 V. Therefore, in the case where a two-series and one-parallel battery-pack is charged, each cell is about 4.3 V and 4.1 V at a charge terminal voltage of 4.2 V per cell which is currently most common. If the charge voltage exceeds 4.3 V, that is undesirable. Because the charge-and-discharge cycle characteristics are conspicuously deteriorated, thus particularly damages the stability of a positive-electrode material.

Accordingly, the internal short detection circuit 11 may also decide that an internal short is generated, if the accumulative electricity-quantity Q1 is larger, by 3 percent or over, than the reference electricity-quantity Q0. More desirably, it should decide that an internal short is generated, if the accumulative electricity-quantity Q1 is larger, by 5 percent or over, than the reference electricity-quantity Q0. In this way, if the accumulative electricity-quantity Q1 is larger, by 3 percent to 15 percent or over, than the reference electricity-quantity Q0, the decision is made that an internal short is generated. Hence, taking into account a measurement error in an actual electricity-quantity, a decision can be made whether an internal short is generated in the secondary-battery. Besides, the internal short detection apparatus 1 can also be applied to a combinational battery formed by joining secondary batteries in series or in parallel.

In addition, the measured accumulative electricity-quantity Q1 and the reference electricity-quantity Q0 stored in the electricity-quantity storage circuit 10 are compared for each charge and discharge cycle. Then, if the accumulative electricity-quantity Q1 is larger than the reference electricity-quantity Q0, the decision is made that an internal short is generated. On the other hand, if the accumulative electricity-quantity Q1 is equal to, or smaller than, the reference electricity-quantity Q0, the decision is made that an internal short is not generated. Then, the reference electricity-quantity Q0 stored in the electricity-quantity storage circuit 10 is rewritten into the accumulative electricity-quantity Q1. Therefore, an internal short can be detected based on the electricity-quantity which varies according to each charge and discharge cycle.

Herein, a variation will be described of the internal short detection apparatus 1 according to the present invention. In addition to a secondary-battery's internal short or a secondary-battery's degradation caused by charge and discharge cycles, a change in voltage attributed to a noise or the like may vary the timing in starting or finishing accumulating the measured electricity quantities Q1, thus changing the measured electricity-quantity Q1 irregularly. In this case, an internal short can be detected in error, or its detection may be missed out. Thus, as described in the following variation, if the electricity-quantity Q1 is larger, continuously over several cycles, than the electricity-quantity Q0, then the decision may also be made that a secondary-battery supposed to be detected is subjected to an internal short.

In the case where the electricity-quantity Q1 increases irregularly, a wrong detection can be obtained. Hence, as shown in Table 3, if the measured electricity-quantity Q1 passes beyond the reference electricity-quantity Q0, a decision is first held up. Then, if the measured electricity-quantity Q1 exceeds the reference electricity-quantity Q0 continuously over several charge and discharge cycles, the decision is made that an internal short is generated. This helps hinder any false detection.

TABLE 3

| CYCLE NUMBER | REFERENCE ELECTRICITY QUANTITY Q0 (mAh) | MEASURED ELECTRICITY QUANTITY Q1 (mAh) | INTERNAL SHORT DECISION |
|---|---|---|---|
| 1 | 2000 | 1200 | OK |
| 2 | 1200 | 1198 | OK |
| 3 | 1198 | 1197 | OK |
| ... | ... | ... | ... |
| 623 | 384 | 384 | OK |
| 624 | 384 | 450 | RESERVE |
| 625 | 450 | 383 | OK |

In Table 3, from the first cycle to the 623-th cycle, the measured electricity-quantity Q1 is equal to, or smaller than, the reference electricity-quantity Q0. In contrast, the measured electricity-quantity Q1 (450 mAh) in the 624-th cycle is larger, by 3 percent or over, than the reference electricity-quantity Q0 (384 mAh). Thus, an internal short may be generated, but this decision is reserved. Then, the measured electricity-quantity Q1 (383 mAh) in the 625-th cycle is larger is smaller than the reference electricity-quantity Q0 (450 mAh), so that the decision is made that the secondary-battery is normal.

However, in this case, as shown in the following Table 4, the reference electricity-quantity Q0 is changed to the electricity-quantity Q1 which has irregularly risen. Thereby, even if an internal short is really produced, the decision may also be made by mistake that it is normal.

TABLE 4

| CYCLE NUMBER | REFERENCE ELECTRICITY QUANTITY Q0 (mAh) | MEASURED ELECTRICITY QUANTITY Q1 (mAh) | INTERNAL SHORT DECISION |
|---|---|---|---|
| 1 | 2000 | 1200 | OK |
| 2 | 1200 | 1198 | OK |
| 3 | 1198 | 1197 | OK |
| ... | ... | ... | ... |
| 623 | 384 | 384 | OK |
| 624 | 384 | 450 | RESERVE |
| 625 | 450→384 | 440 | OK→NG |

For example, in Table 4, the measured electricity-quantity Q1 (450 mAh) in the 624-th cycle is larger, by 3 percent or over, than the reference electricity-quantity Q0 (384 mAh). Thus, an internal short may be generated, but this decision is reserved. Then, the reference electricity-quantity Q0 (384 mAh) is changed to the measured electricity-quantity Q1 (450 mAh). Next, if the measured electricity-quantity Q1 in the 625-th cycle is 440 mAh which is smaller than the reference electricity-quantity Q0 (450 mAh), the decision is made that it is normal. However, this means the decision is made that the electricity-quantity measured by mistake is the reference electricity-quantity. Hence, compared with the reference electricity-quantity Q0 (384 mAh) measured normally, the decision is made that an internal short is generated. Therefore, if the decision is deferred, then by not updating the reference electricity-quantity Q0, the detection can be prevented from being missed out.

Figure 4:
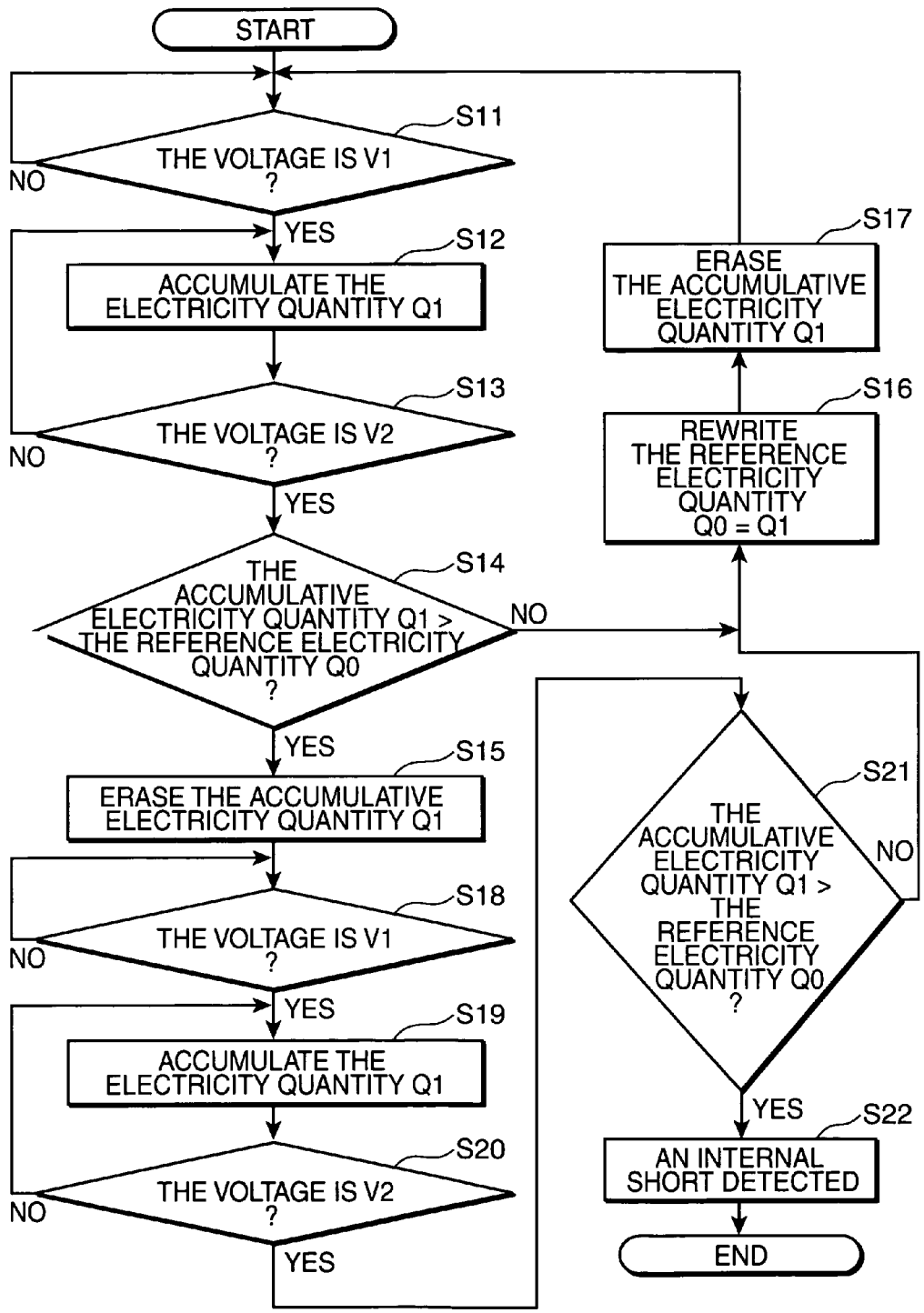
FIG. 4 is a flow chart, showing a first variation of the internal short detection apparatus.

FIG. 4 is a flow chart, showing a first variation of the internal short detection apparatus 1. The configuration of the internal short detection apparatus according to the first variation is the same as the internal short detection apparatus 1 shown in FIG. 1. Thus, its description is omitted. In FIG. 4, the processing of steps S11 to S14, S16 and S17 is the same as the processing of the steps S1 to S4, S6 and S7 of FIG. 3. Hence, its description is omitted.

If the decision is made that the electricity-quantity Q1 is greater than the electricity-quantity Q0 for a normal secondary-battery (YES at a step S14), then in a step S15, the internal short detection circuit 11 erases the accumulative electricity-quantity Q1. Next, the processing of steps S18 to S21 is the same as the processing of the steps S1 to S4 of FIG. 3. Thus, its description is omitted.

If the decision is made that the electricity-quantity Q1 is greater than the electricity-quantity Q0 for a normal secondary-battery (YES at a step S21), then in a step S22, the internal short detection circuit 11 decides that an internal short is generated in the secondary-battery. Then, it outputs, to the outside, an internal short signal for notifying external equipment that the internal short is generated.

On the other hand, if the decision is made that the electricity-quantity Q1 is equal to the electricity-quantity Q0, or if the decision is made that the electricity-quantity Q1 is smaller than the electricity-quantity Q0 (NO at the step S21), the processing proceeds to a step S16. Then, the internal short detection circuit 11 decides that the secondary-battery is normal. Sequentially, it rewrites the reference electricity-quantity Q0 stored in the electricity-quantity storage circuit 10 into the electricity-quantity Q1.

In this way, only in the case where the accumulative electricity-quantity Q1 continues to be larger, a plurality of times, than the reference electricity-quantity Q0, then the decision is made that an internal short is generated. Specifically, a change in voltage attributed to a noise or the like may vary the timing in starting or finishing accumulating the accumulative electricity quantities Q1, thus increasing the accumulative electricity-quantity Q1 temporarily. In this case, the decision may also be made that an internal short is generated, though no such internal short is actually generated. However, only if the decision that the accumulative electricity-quantity Q1 is larger than the reference electricity-quantity Q0 is continuously made several times, then the decision is made that an internal short is generated. This prevents an internal short from being detected in error, or from failing to be detected.

In the above described first variation, its description is given in the case where the measured electricity-quantity Q1 rises irregularly. Next, another case will be described in which the measured electricity-quantity Q1 decreases irregularly. If the measured electricity-quantity Q1 decreases irregularly, as shown in the following Table 5, the measured electricity-quantity Q1 may exceed the reference electricity-quantity Q0 in the next charge and discharge cycle. This may possibly detect an internal short by mistake.

TABLE 5

| CYCLE NUMBER | REFERENCE ELECTRICITY QUANTITY Q0 (mAh) | MEASURED ELECTRICITY QUANTITY Q1 (mAh) | INTERNAL SHORT DECISION |
|---|---|---|---|
| 1 | 2000 | 1200 | OK |
| 2 | 1200 | 1198 | OK |
| 3 | 1198 | 1197 | OK |
| ... | ... | ... | ... |
| 623 | 384 | 384 | OK |
| 624 | 384 | 324 | OK |
| 625 | 324 | 383 | NG |

For example, in Table 5, the measured electricity-quantity Q1 (324 mAh) in the 624-th cycle is smaller than the reference electricity-quantity Q0 (384 mAh). Thus, the decision is made that the secondary-battery is normal. Then, the reference electricity-quantity Q0 (384 mAh) is changed to the measured electricity-quantity Q1 (324 mAh). Next, if the measured electricity-quantity Q1 in the 625-th cycle is 383 mAh which is larger, by 3 percent or over, than the reference electricity-quantity Q0 (324 mAh), the decision is made that an internal short is generated. However, this means the decision is made that the electricity-quantity measured by mistake is the reference electricity-quantity. Hence, compared with the reference electricity-quantity Q0 (384 mAh) measured normally, the decision is made that the secondary-battery is normal.

Therefore, as shown in the following Table 6, as the reference electricity-quantity Q0 to be compared with the measured electricity-quantity Q1, the reference electricity-quantity Q0B in the preceding charge and discharge cycle, and the reference electricity-quantity Q0A in the charge and discharge cycle preceding this cycle, are stored. If the measured electricity-quantity Q1 becomes larger than the greater one of the reference electricity quantities Q0A and Q0B, then the decision is made that an internal short is generated.

TABLE 6

| CYCLE NUMBER | REFERENCE ELECTRICITY QUANTITY Q0A (mAh) | REFERENCE ELECTRICITY QUANTITY Q0B (mAh) | MEASURED ELECTRICITY QUANTITY Q1 (mAh) | INTERNAL SHORT DECISION |
|---|---|---|---|---|
| 1 | 2000 | 2000 | 1200 | OK |
| 2 | 2000 | 1200 | 1198 | OK |
| 3 | 1200 | 1198 | 1197 | OK |
| ... | ... | ... | ... | ... |
| 623 | 387 | 386 | 384 | OK |
| 624 | 386 | 384 | 324 | OK |
| 625 | 384 | 324 | 383 | NG→OK |

Figure 5:
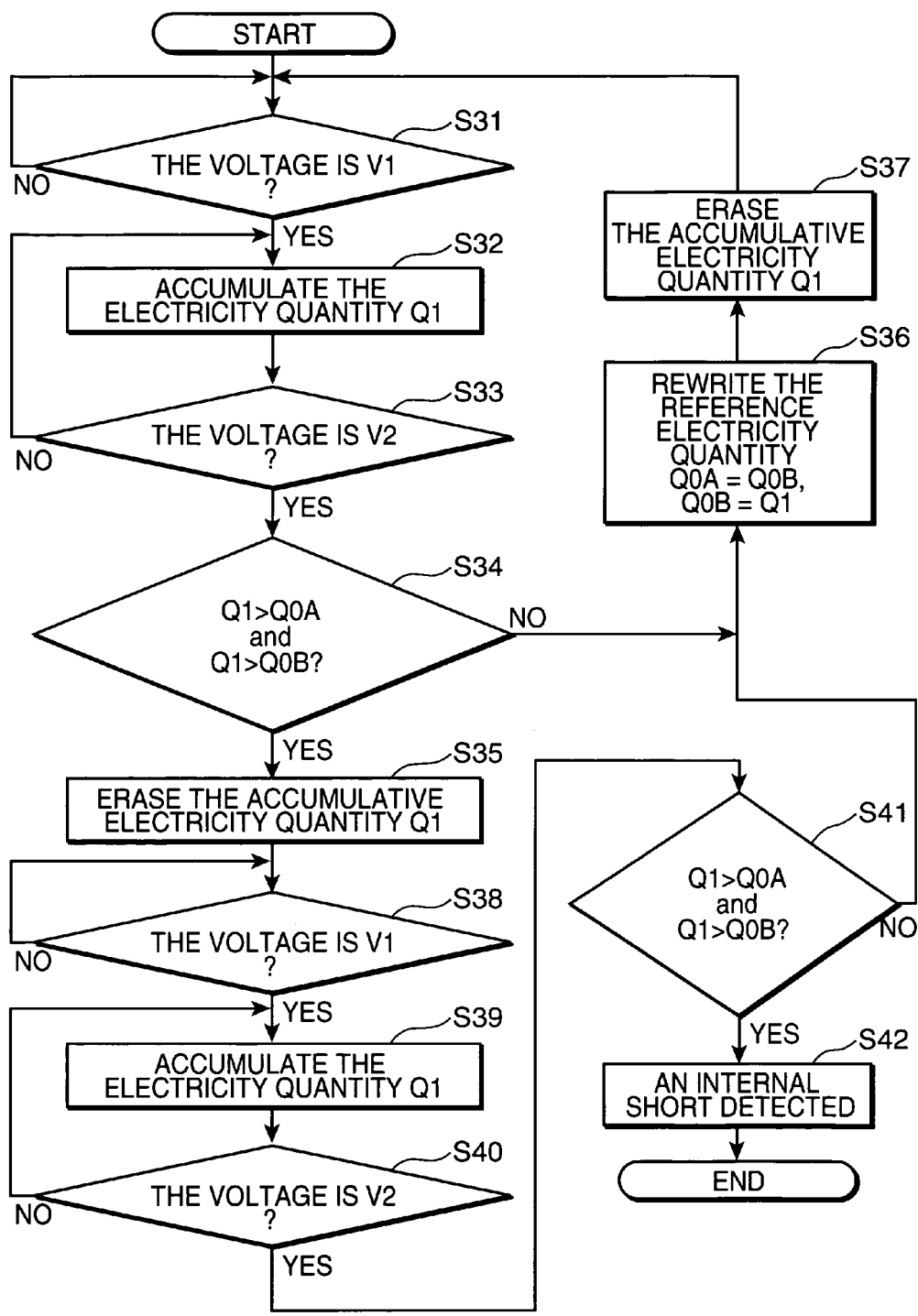
FIG. 5 is a flow chart, showing a second variation of the internal short detection apparatus.

FIG. 5 is a flow chart, showing a second variation of the internal short detection apparatus 1. The configuration of the internal short detection apparatus according to the second variation is the same as the internal short detection apparatus 1 shown in FIG. 1. Thus, its description is omitted. In FIG. 5, the processing of steps S31 to S33 is the same as the processing of the steps S1 to S3 of FIG. 3, and thus, its description is omitted.

In the second variation, the electricity-quantity storage circuit 10 stores the reference electricity quantities Q0A and Q0B a plurality of times. The reference electricity-quantity Q0B is the measured electricity-quantity Q1 which was measured the last time. The reference electricity-quantity Q0A is the measured electricity-quantity Q1 which was measured the last time but one. The internal short detection circuit 11 compares the accumulative electricity-quantity Q1 measured by the electricity-quantity accumulation circuit 9 and the reference electricity quantities Q0A and Q0B at the number of the plurality of times stored in the electricity-quantity storage circuit 10. If the accumulative electricity-quantity Q1 is larger than each reference electricity-quantity Q0A and Q0B at the number of the plurality of times, the internal short detection circuit 11 decides that an internal short is generated. On the other hand, if the accumulative electricity-quantity Q1 is equal to, or smaller than, at least one reference electricity-quantity of the reference electricity quantities Q0A and Q0B at the number of the plurality of times, the internal short detection circuit 11 decides that an internal short is not generated. Then, it rewrites the reference electricity-quantity Q0A stored in the electricity-quantity storage circuit 10 into the reference electricity-quantity Q0B. At the same time, it rewrites the reference electricity-quantity Q0B stored in the electricity-quantity storage circuit 10 into the accumulative electricity-quantity Q1.

In a step S34, the internal short detection circuit 11 compares the accumulative electricity-quantity Q1 spent on charging the battery from the first voltage V1 to the second voltage V2 and the reference electricity quantities Q0A and Q0B stored in the electricity-quantity storage circuit 10. If the decision is made the accumulative electricity-quantity Q1 is greater than the reference electricity-quantity Q0A and that the accumulative electricity-quantity Q1 is greater than the reference electricity-quantity Q0B (YES at the step S34), then in a step S35, the internal short detection circuit 11 erases the accumulative electricity-quantity Q1.

On the other hand, if the decision is made that the accumulative electricity-quantity Q1 is equal to, or smaller than, at least either reference electricity-quantity of the reference electricity-quantity Q0A and the reference electricity-quantity Q0B (NO at the step S34), then in a step S36, the internal short detection circuit 11 rewrites the reference electricity-quantity Q0A stored in the electricity-quantity storage circuit 10 into the reference electricity-quantity Q0B. Simultaneously, it rewrites the reference electricity-quantity Q0B stored in the electricity-quantity storage circuit 10 into the accumulative electricity-quantity Q1. Next, in a step S37, the internal short detection circuit 11 erases the accumulative electricity-quantity Q1.

The processing of steps S38 to S41 is the same as the processing of the steps S31 to S34 of FIG. 5, and thus, its description is omitted.

If the decision is made the electricity-quantity Q1 is greater than the reference electricity-quantity Q0A and that the electricity-quantity Q1 is greater than the reference electricity-quantity Q0B (YES at a step S41), then in a step S35, the internal short detection circuit 11 decides that an internal short is generated in the secondary-battery. Then, it outputs, to the outside, an internal short signal for notifying external equipment that the internal short is generated.

On the other hand, if the decision is made that the accumulative electricity-quantity Q1 is equal to, or smaller than, at least either reference electricity-quantity of the reference electricity-quantity Q0A and the reference electricity-quantity Q0B (NO at the step S41), the processing proceeds to a step S36.

In this way, the reference electricity quantities Q0A and Q0B at the number of several times are stored in the electricity-quantity storage circuit 10. Then, a comparison is made between the measured accumulative electricity-quantity Q1 and the reference electricity quantities Q0A and Q0B which correspond to the number of the several times stored in the electricity-quantity storage circuit 10. Only in the case where the accumulative electricity-quantity Q1 is larger than the greatest one of all the reference electricity quantities Q0A and Q0B which correspond to the number of the several times, the decision is made that an internal short is generated. This prevents an internal short from being detected in error, or its detection from being missed out.

By the way, in the second variation, its description is given in the case where the measured electricity-quantity exceeds the reference electricity-quantity, two cycles successively. However, the present invention is not limited especially to this. Taking into account the capability to detect an internal short and the effect of a failure in detection, suitably, electricity quantities measured continuously over three cycles or more may also be used in deciding whether an internal short is produced.

Furthermore, based upon the temperature of a secondary-battery, the internal short detection circuit 11 may also correct the accumulative electricity-quantity Q1 calculated by the electricity-quantity accumulation circuit 9. Specifically, the internal short detection apparatus 1 further includes a temperature sensor which takes the surface temperature of the secondary-battery 5, and a correction-table storage section which stores a correction table expressing the relation between the temperature of the secondary-battery 5 and a correction factor. Referring to the correction-table storage section, the internal short detection circuit 11 specifies a correction factor for the temperature indicated by a temperature detection signal outputted from the temperature sensor. Then, it multiplies the accumulative electricity-quantity Q1 calculated in the electricity-quantity accumulation circuit 9 by this correction factor. Thereby, the accumulative electricity-quantity is corrected. Incidentally, in the correction table, the temperature of the secondary-battery 5 and the value of a correction factor for each temperature are related and stored. These correction-factor values are obtained in advance from an experiment or the like. In this way, based upon the temperature of a secondary-battery, the internal short detection circuit 11 corrects the accumulative electricity-quantity Q1 calculated by the electricity-quantity accumulation circuit 9. This helps calculate an accumulative electricity-quantity accurately, and detect an internal short being generated more precisely.

Figure 6:
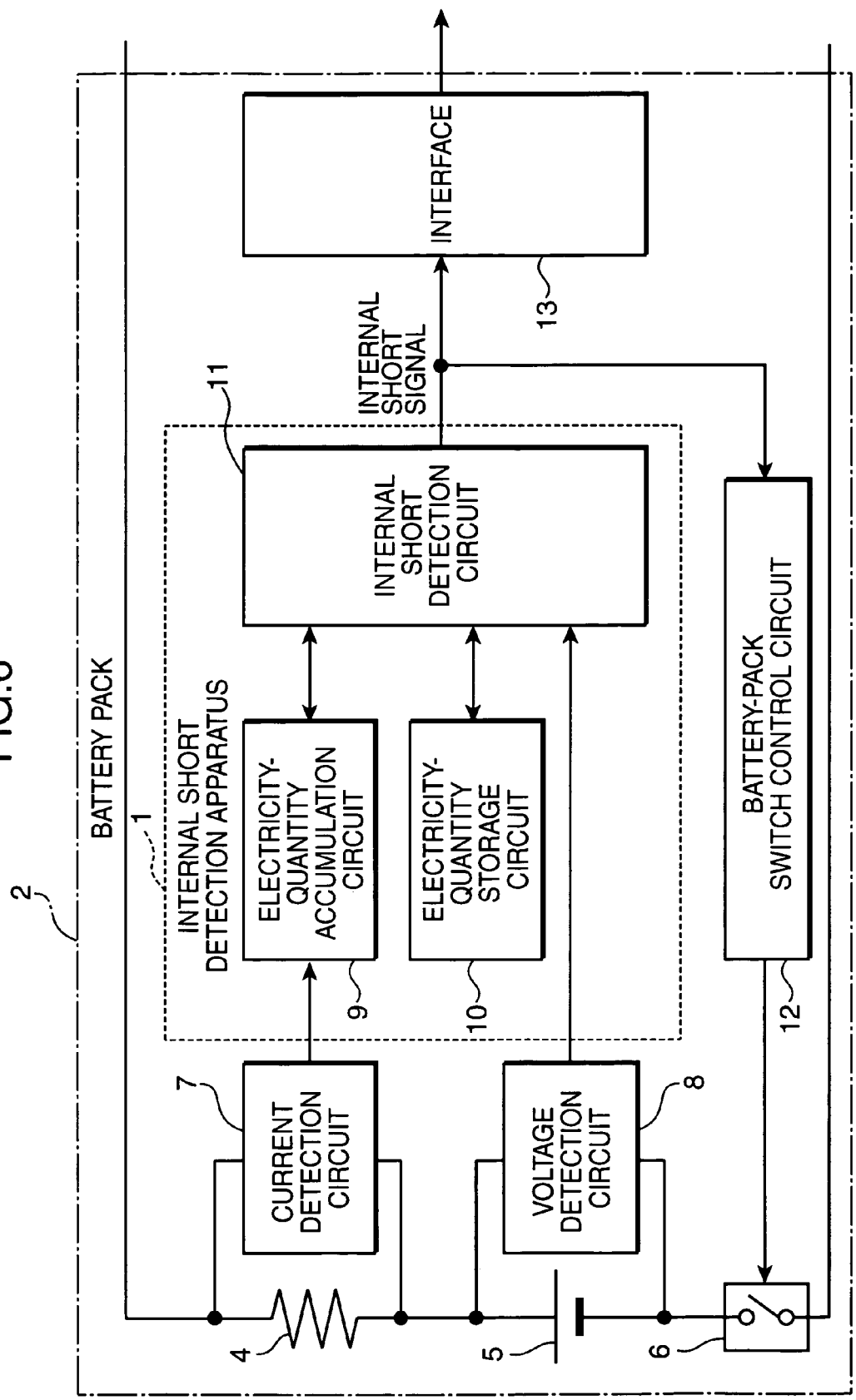
FIG. 6 is a circuit diagram, showing the electrical configuration of a battery-pack including the internal short detection apparatus according to the present invention.

Next, a secondary-battery battery-pack will be described which is provided with the internal short detection apparatus shown in FIG. 1. FIG. 6 is a circuit diagram, showing the electrical configuration of a battery-pack 2 which includes the internal short detection apparatus 1 according to the present invention. The battery-pack 2 includes: a secondary-battery 5; a voltage detection circuit 8; a resistor 4 for detecting an electric current; a current detection circuit 7 which detects an electric current using a voltage applied to the resistor 4; the internal short detection apparatus 1; an interface 13 which outputs an internal short signal to the outside; a battery-pack switch 6 which is disposed in series between the secondary-battery 5 and electronic equipment; and a battery-pack switch control circuit 12 which executes control so that the battery-pack switch 6 is turned on and off.

The voltage detection circuit 8 and the current detection circuit 7 outputs information which they detect to the internal short detection apparatus 1. The internal short detection apparatus 1 decides whether an internal short is generated. The interface 13 receives an internal short signal from the internal short detection apparatus 1. Then, it sends this to external equipment and the battery-pack switch control circuit 12. The battery-pack switch control circuit 12 has the function of cutting off an I/O circuit for an electric current from a secondary-battery to an external load (i.e., external equipment). Based on an internal short signal, it controls the battery-pack switch 6 for a secondary-battery.

According to the above described configuration, based on an internal short signal, an electric current can be prevented from running into and out of a secondary-battery in which an internal short is generated. This makes the battery-pack safer.

Next, an internal short detection processing will be specifically described in the battery-pack 2 according to this embodiment. In the battery-pack 2, first, a voltage signal is sent at intervals of 10 ms to the internal short detection apparatus 1 from the voltage detection circuit 8 which detects the voltage of the secondary-battery 5 which is a subject of detection. The 1-m$\Omega$ resistor 4 for detecting an electric current is connected in series to the secondary-battery 5 to be detected. Then, a signal is received from the internal short detection apparatus 1, and the electric current passing through the secondary-battery 5 is calculated using the voltage applied to the resistor 4. Sequentially, a signal is sent to the internal short detection apparatus 1. On the other hand, if the internal short detection apparatus 1 detects an internal short being generated in the secondary-battery 5, an internal short signal is sent from the internal short detection apparatus 1 to the interface 13 and the battery-pack switch control circuit 12.

Next, the interface 13 sends the internal short signal to external equipment. Then, if the difference between the reference electricity-quantity Q0 and the accumulative electricity-quantity Q1 is equal to, or more than, 100 mAh, then the battery-pack switch control circuit 12 controls the battery-pack switch 6. Thereby, the flow of an electric current into and from the secondary-battery 5 is shut off.

As described above, the voltage detection circuit 8 detects a voltage up to which the secondary-battery 5 is charged, and the current detection circuit 7 detects an electric current which flows through the secondary-battery 5. Then, an internal short signal is received which is outputted when the internal short detection apparatus 1 decides that an internal short is generated. Sequentially, the battery-pack switch 6 which turns on and off the power supplied outside from the secondary-battery 5 is turned off.

Therefore, the secondary-battery 5 in which an internal short is generated can be properly controlled. Hence, after the internal short has been generated, the secondary-battery 5 can be prevented from continuing to be used. This helps keep an internal short from being repeatedly produced and hinder the secondary-battery 5 from being heated. This makes the battery-pack 2 safer.

Figure 7:
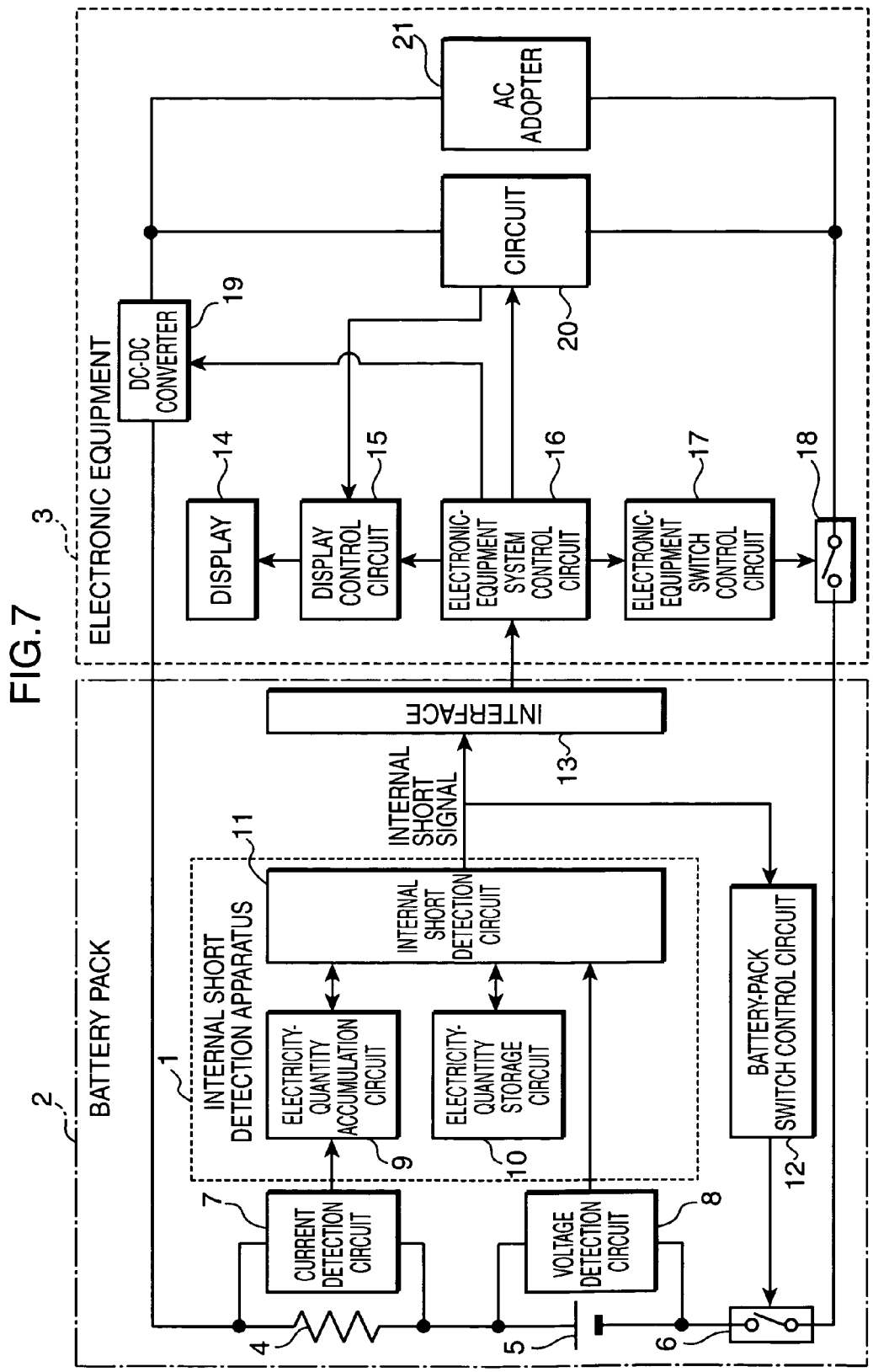
FIG. 7 is a circuit diagram, showing the electrical configuration of electronic equipment including the battery-pack according to the present invention.

Sequentially, electronic equipment will be described which has the function of detecting an internal short. FIG. 7 is a circuit diagram, showing the electrical configuration of electronic equipment including the battery-pack 2 according to the present invention. Electronic equipment 3 includes: a DC-DC converter 19 which charges the secondary-battery 5; an AC adopter 21; a circuit (i.e., the load section) 20; an electronic-equipment system control circuit 16 which receives an internal short signal outputted from the battery-pack 2 and controls each system inside of the electronic equipment 3; a display control circuit 15 which receives a signal from the electronic-equipment system control circuit 16 and allows a display 14 to display the fact that an internal short signal is generated; and an electronic-equipment switch control circuit 17 which receives a signal from the electronic-equipment system control circuit 16 and controls an electronic-equipment switch 18 located on the wiring with the secondary-battery 5 inside of the electronic equipment 3. Incidentally, the circuit 20 includes various circuits which each give an electrical load inside of the electronic equipment 3.

Herein, an internal short detection processing will be specifically described in the electronic equipment 3 according to this embodiment. In the electronic equipment 3, when an internal short is detected, an internal short detection signal is sent to the electronic-equipment system control circuit 16 from the interface 13 of the battery-pack 2. Next, the electronic-equipment system control circuit 16 sends the internal short detection signal to the electronic-equipment switch control circuit 17 and the display control circuit 15. Sequentially, if the difference between the reference electricity-quantity Q0 and the accumulative electricity-quantity Q1 is equal to, or more than, 50 mAh, then the electronic-equipment switch control circuit 17 controls the electronic-equipment switch 18. Thereby, the flow of an electric current from the battery-pack 2 to the electronic equipment 3 and vice versa is cut off. In contrast, if the difference between the reference electricity-quantity Q0 and the accumulative electricity-quantity Q1 is less than 50 mAh, then the display control circuit 15 controls the display 14 so that it displays the fact that the power-source is abnormal. This prompts a user to execute the backup of equipment data or the like.

As described so far, in the internal short detection apparatus according to the present invention, an internal short in a secondary-battery can be detected with precision. Using a battery-pack including this internal short detection apparatus and electronic equipment including this battery-pack, its safety can be improved.

Furthermore, according to the configuration of the present invention, a user is notified of the power-source's abnormality based on an internal short signal. This helps let the user execute a processing such as the backup of data, before electronic equipment becomes completely unusable. Moreover, a secondary-battery in which an internal short is generated cannot be continuously used, so that an electric current can be prevented from running into and out of the secondary-battery subjected to the internal short on the side of electronic equipment.

Incidentally, after an internal short is generated, for example, the following processing or the like may also be suitably executed. If an electricity-quantity differs beyond a specific threshold value from a charge electricity-quantity in the past, the decision is made that this internal short is serious. Then, an electric current is shut off. On the other hand, if it differs by the specific threshold value or under, the decision is made that the internal short is light. Then, this is displayed in the display 14.

In addition, in this embodiment, a signal indicating an internal short outputted from the battery-pack 2 is received, and then, the fact that the internal short has been produced is displayed in the display 14. However, the present invention is not limited especially to this. For example, the electronic equipment 3 may also include an audio output section, and an audio-output control section which receives a signal indicating an internal short outputted from a battery-pack and allows the audio output section to output, in an audio form, the fact that the internal short has been produced.

As described above, the DC-DC converter 19 charges the secondary-battery 5 provided in the battery-pack 2. Then, a signal indicating an internal short outputted from the battery-pack 2 is received, and then, the fact that the internal short has been produced is displayed in the display 14 (i.e., the alarming means). Therefore, a user can become accurately aware that the secondary-battery 5 is abnormal. This makes it possible to execute an appropriate processing such as the backup of data.

Furthermore, a signal indicating an internal short outputted from the battery-pack 2 is received, and then, the electronic-equipment switch 18 which turns on and off the power supplied to the circuit 20 from the secondary-battery 5 is turned off. Therefore, the secondary-battery 5 which has undergone the internal short can be prevented from being continuously used as the electronic equipment 3's power-source. This makes the electronic equipment 3 safer.

Moreover, an internal short signal indicating an internal short outputted from the battery-pack 2, as well as a subtraction value obtained when the reference electricity-quantity Q0 is subtracted from the accumulative electricity-quantity Q1, are received by the electronic-equipment switch control circuit 17. Then, if the subtraction value is equal to, or more than, a predetermined value, the electronic-equipment switch 18 is turned off. Sequentially, the internal short signal and the subtraction value are received by the display control circuit 15. If the subtraction value is less than the predetermined value, the fact that the internal short has been produced is displayed in the display 14.

Therefore, if a subtraction value left when the reference electricity-quantity Q0 is subtracted from the accumulative electricity-quantity Q1 is equal to, or more than, a predetermined value, the electronic-equipment switch 18 is turned off. If the subtraction value is less than the predetermined value, the fact that the internal short has been produced is displayed in the display 14. Consequently, if an internal short is slight, this is only displayed so that a user is informed that the internal short is generated. On the other hand, if an internal short is grave, the electronic-equipment switch 18 is turned off. Thereby, the secondary-battery 5 subjected to the internal short can be prevented from being continuously used as the power-source.

Incidentally, in this embodiment, if an internal short signal is detected, then according to the subtraction value obtained when the reference electricity-quantity Q0 is subtracted from the accumulative electricity-quantity Q1, the fact that the internal short has been generated is displayed in the display 14, or the electronic-equipment switch 18 is turned off. However, the present invention is not limited especially to this. If an internal short signal is detected, then without displaying the fact that the internal short has been generated, only the electronic-equipment switch 18 may also be turned off.

In this case, a signal indicating an internal short outputted from the battery-pack 2 is received, and then, the electronic-equipment switch 18 which turns on and off the power supplied to the circuit 20 from the secondary-battery 5 is turned off. Therefore, the secondary-battery 5 which has undergone the internal short can be prevented from being continuously used as the electronic equipment 3's power-source. This makes the electronic equipment 3 safer.

The specific embodiment described so far mainly includes inventions having the following configurations.

A secondary-battery internal short detection apparatus according to an aspect of the present invention which detects an internal short in a secondary-battery, comprising: an electricity-quantity storage circuit which stores a reference electricity-quantity necessary for charging the secondary-battery from a first voltage to a second voltage higher than the first voltage; an electricity-quantity accumulation circuit which measures an accumulative electricity-quantity necessary for charging the secondary-battery from the first voltage to the second voltage; and an internal short detection circuit which compares the accumulative electricity-quantity measured by the electricity-quantity accumulation circuit and the reference electricity-quantity stored in the electricity-quantity storage circuit, if the accumulative electricity-quantity is larger than the reference electricity-quantity, then decides that an internal short is generated, and if the accumulative electricity-quantity is equal to, or smaller than, the reference electricity-quantity, then decides that an internal short is not generated and rewrites the reference electricity-quantity stored in the electricity-quantity storage circuit into the accumulative electricity-quantity.

A secondary-battery internal short detection method according to another aspect of the present invention for detecting an internal short in a secondary-battery, comprising: an electricity-quantity accumulating step of measuring an accumulative electricity-quantity necessary for charging the secondary-battery from a first voltage to a second voltage higher than the first voltage; an electricity-quantity comparing step of comparing the accumulative electricity-quantity measured in the electricity-quantity accumulating step and a reference electricity-quantity which is stored in advance in an electricity-quantity storage circuit and is necessary for charging the secondary-battery from the first voltage to the second voltage; an internal short detecting step of deciding that an internal short is generated, if the accumulative electricity-quantity is larger than the reference electricity-quantity in the electricity-quantity comparing step; and a reference electricity-quantity rewriting step of deciding that an internal short is not generated and rewriting the reference electricity-quantity stored in the electricity-quantity storage circuit into the accumulative electricity-quantity, if the accumulative electricity-quantity is equal to, or smaller than, the reference electricity-quantity in the electricity-quantity comparing step.

According to these configurations, a reference electricity-quantity necessary for charging the secondary-battery from a first voltage to a second voltage is stored in an electricity-quantity storage circuit. Then, an accumulative electricity-quantity is measured which is necessary for charging the secondary-battery from the first voltage to the second voltage. Sequentially, a comparison is made between the measured accumulative electricity-quantity and the reference electricity-quantity stored in the electricity-quantity storage circuit. If the accumulative electricity-quantity is larger than the reference electricity-quantity, the decision is made that an internal short is generated. On the other hand, if the accumulative electricity-quantity is equal to, or smaller than, the reference electricity-quantity, the decision is made that an internal short is not generated. Then, the reference electricity-quantity stored in the electricity-quantity storage circuit is rewritten into the accumulative electricity-quantity.

If an internal short is produced in the secondary-battery, the energy kept in the secondary-battery is emitted outside as heat and disappears. Therefore, the electricity-quantity required for charging the secondary-battery becomes larger than in the case where an internal short is not produced.

By the way, a reduction in the discharge electricity-quantity or a drop in the discharge voltage which may be caused by an internal short can occur, even when the secondary-battery is degraded as charge and discharge cycles are repeated at a normal time. Hence, an error can be made in detection. On the other hand, an increase in the electricity-quantity of a charge at the time of charge and discharge cycles cannot take place when the normal secondary-battery is used in a normal environment.

Therefore, a comparison is made between the measured accumulative electricity-quantity and the reference electricity-quantity stored in the electricity-quantity storage circuit, and if the accumulative electricity-quantity is larger than the reference electricity-quantity, the decision is made that an internal short is generated. This makes it possible to precisely detecting an internal short being generated in the secondary-battery. Further, even if no internal short is generated, the electricity-quantity varies which is required for charging when the secondary-battery degrades. However, if the decision is made that no internal short is generated, the reference electricity-quantity stored so far is rewritten to the electricity-quantity at the charge time used when this decision is made. This helps improve the precision of a detection. Still further, using an electricity-quantity at a charge time in one and the same secondary-battery, a decision is made whether an internal short is generated. Thus, the difference between secondary batteries to be compared can be prevented from producing some effect. This helps certainly detect an internal short being generated.

Furthermore, in the above described secondary-battery internal short detection apparatus, it is preferable that if the accumulative electricity-quantity is larger, by 3 percent or over, than the reference electricity-quantity, then the internal short detection circuit decide that an internal short is generated.

According to this configuration, if the accumulative electricity-quantity is larger, by 3 percent or over, than the reference electricity-quantity, then the internal short detection circuit decide that an internal short is generated. Therefore, taking into account a measurement error in an actual electricity-quantity, a decision can be made whether an internal short is generated in the secondary-battery. Besides, this apparatus can also be applied to a combinational battery formed by joining secondary batteries in series or in parallel.

In addition, in the above described secondary-battery internal short detection apparatus, it is preferable that the internal short detection circuit: compare, for each charge and discharge cycle, the accumulative electricity-quantity measured by the electricity-quantity accumulation circuit and the reference electricity-quantity stored in the electricity-quantity storage circuit; if the accumulative electricity-quantity is larger than the reference electricity-quantity, then decide that an internal short is generated; and if the accumulative electricity-quantity is equal to, or smaller than, the reference electricity-quantity, then decide that an internal short is not generated and rewrite the reference electricity-quantity stored in the electricity-quantity storage circuit into the accumulative electricity-quantity.

According to this configuration, the measured accumulative electricity-quantity and the reference electricity-quantity stored in the electricity-quantity storage circuit are compared for each charge and discharge cycle. If the accumulative electricity-quantity is larger than the reference electricity-quantity, the decision is made that an internal short is generated. On the other hand, if the accumulative electricity-quantity is equal to, or smaller than, the reference electricity-quantity, then without deciding that an internal short is generated, the reference electricity-quantity stored in the electricity-quantity storage circuit is rewritten into the accumulative electricity-quantity. Therefore, an internal short can be detected based on the electricity-quantity which varies according to each charge and discharge cycle.

Furthermore, in the above described secondary-battery internal short detection apparatus, preferably, only if the accumulative electricity-quantity continues to be larger, a plurality of times, than the reference electricity-quantity, then the internal short detection circuit should decide that an internal short is generated.

According to this configuration, only if the accumulative electricity-quantity continues to be larger, a plurality of times, than the reference electricity-quantity, then the decision is made that an internal short is generated. A change in voltage attributed to a noise or the like may vary the timing in starting or finishing accumulating the accumulative electricity quantities, thus increasing the accumulative electricity-quantity temporarily. In this case, the decision may also be made that an internal short is generated, though no such internal short is actually generated. However, only if the decision that the accumulative electricity-quantity is larger than the reference electricity-quantity is continuously made several times, then the decision is made that an internal short is generated. This prevents an internal short from being detected in error, or from failing to be detected.

Moreover, in the above described secondary-battery internal short detection apparatus, it is preferable that the electricity-quantity storage circuit store the reference electricity-quantity at the number of a plurality of times; and the internal short detection circuit: compare the accumulative electricity-quantity measured by the electricity-quantity accumulation circuit and the reference electricity-quantity at the number of the plurality of times stored in the electricity-quantity storage circuit; and only if the accumulative electricity-quantity is larger than the reference electricity-quantity all the plurality of times, then decide that an internal short is generated.

According to this configuration, the reference electricity quantities which correspond to the number of a plurality of times are stored in the electricity-quantity storage circuit. Then, a comparison is made between the measured accumulative electricity-quantity and the reference electricity quantities which correspond to the number of the plurality of times stored in the electricity-quantity storage circuit. Only if the accumulative electricity-quantity is larger than the greatest one of all the reference electricity quantities which correspond to the number of the plurality of times, then the decision is made that an internal short is generated. This prevents an internal short from being detected in error, or from failing to be detected.

A battery-pack according to still another aspect of the present invention, comprising: a secondary-battery; a voltage detection circuit which detects a voltage up to which the secondary-battery is charged; a current detection circuit which detects an electric current which passes through the secondary-battery; the above described internal short detection apparatus; a battery-pack switch which turns on and off the power supplied to the outside from the secondary-battery; and a battery-pack switch control circuit which receives an internal short signal outputted when the internal short detection apparatus decides that an internal short is generated, and turns off the battery-pack switch.

According to this configuration, a voltage detection circuit detects a voltage up to which the secondary-battery is charged, and a current detection circuit detects an electric current which flows through the secondary-battery. Then, an internal short signal is received which is outputted when the internal short detection apparatus decides that an internal short is generated. Sequentially, the battery-pack switch is turned off which turns on and off the power supplied to the outside from the secondary-battery.

Therefore, the secondary-battery in which an internal short is generated can be properly controlled. Hence, after the internal short has been generated, the secondary-battery can be prevented from continuing to be used. This helps keep an internal short from being repeatedly produced and hinder the secondary-battery from being heated. This makes the battery-pack safer.

Electronic equipment according to still another aspect of the present invention in which the above described battery-pack is used as a power-source, comprising: a battery charger which charges a secondary-battery provided in the battery-pack; an alarming means; and an alarm control circuit which receives a signal indicating an internal short which is outputted from the battery-pack, and allows the alarming means to warn that the internal short is generated.

According to this configuration, a battery charger charges a secondary-battery provided in the battery-pack. Then, a signal indicating an internal short is received which is outputted from the battery-pack, and the alarming means warns that the internal short is generated. Therefore, a user can become accurately aware that a secondary-battery is abnormal. This makes it possible to execute an appropriate processing such as the backup of data.

In addition, the above described electronic equipment, preferably, should further comprise: a load section to which the power is supplied from the secondary-battery; an electronic-equipment switch which turns on and off the power supplied to the load section from the secondary-battery; and an electronic-equipment switch control circuit which receives a signal indicating an internal short which is outputted from the battery-pack, and turns off the electronic-equipment switch.

According to this configuration, a signal indicating an internal short which is outputted from the battery-pack is received, and an electronic-equipment switch which turns on and off the power supplied to the load section from the secondary-battery is turned off. Therefore, the secondary-battery which has undergone the internal short can be prevented from being continuously used as the electronic equipment's power-source. This makes the electronic equipment safer.

Furthermore, in the above described electronic equipment, it is preferable that the electronic-equipment switch control circuit receive an internal short signal indicating an internal short which is outputted from the battery-pack and a subtraction value left when the reference electricity-quantity is subtracted from the accumulative electricity-quantity, and turn off the electronic-equipment switch if the subtraction value is equal to, or more than, a predetermined value; and the alarm control circuit receive the internal short signal and the subtraction value, and if the subtraction value is less than the predetermined value, allow the alarming means to warn that an internal short is generated.

According to this configuration, the electronic-equipment switch control circuit receives an internal short signal indicating an internal short which is outputted from the battery-pack and a subtraction value left when the reference electricity-quantity is subtracted from the accumulative electricity-quantity. If the subtraction value is equal to, or more than, a predetermined value, the electronic-equipment switch is turned off. Then, the alarm control circuit receives the internal short signal and the subtraction value, and if the subtraction value is less than the predetermined value, the alarming means to warn that an internal short is generated.

Therefore, if a subtraction value left when the reference electricity-quantity is subtracted from the accumulative electricity-quantity is equal to, or more than, a predetermined value, the electronic-equipment switch is turned off. If the subtraction value is less than the predetermined value, the fact that the internal short has been produced is warned by the alarming means. Consequently, if an internal short is slight, this is only warned so that a user is informed that the internal short is generated. On the other hand, if an internal short is grave, the electronic-equipment switch is turned off. Thereby, the secondary-battery subjected to the internal short can be prevented from being continuously used as the power-source.

Electronic equipment according to the present invention in which the above described battery-pack is used as a power-source, comprising: a battery charger which charges a secondary-battery provided in the battery-pack; a load section to which the power is supplied from the secondary-battery; an electronic-equipment switch which turns on and off the power supplied to the load section from the secondary-battery; and an electronic-equipment switch control circuit which receives a signal indicating an internal short which is outputted from the battery-pack, and turns off the electronic-equipment switch.

According to this configuration, a signal indicating an internal short is received which is outputted from the battery-pack, and an electronic-equipment switch is turned off which turns on and off the power supplied to the load section from the secondary-battery. Therefore, after an internal short is produced, the secondary-battery can be prevented from continuing to be used as the electronic equipment's power-source. This makes the electronic equipment safer.

The secondary-battery internal short detection apparatus, the secondary-battery internal short detection method, the battery-pack and the electronic equipment according to the present invention are excellent in safety and useful as portable electronic equipment and its power-source.

This application is based on Japanese patent applications serial Nos. 2005-041980, and 2006-024299 filed in Japan Patent Office on Feb. 18, 2005 and Feb. 1, 2006, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A secondary-battery internal short detection apparatus which detects an internal short in a secondary-battery, comprising:

an electricity-quantity storage circuit which stores a reference electricity-quantity necessary for charging the secondary-battery from a first voltage to a second voltage higher than the first voltage;

an electricity-quantity accumulation circuit which measures an accumulative electricity-quantity necessary for charging the secondary-battery from the first voltage to the second voltage; and an internal short detection circuit which compares the accumulative electricity-quantity measured by the electricity-quantity accumulation circuit and the reference electricity-quantity stored in the electricity-quantity storage circuit, if the accumulative electricity-quantity is larger than the reference electricity-quantity, then decides that an internal short is generated, and if the accumulative electricity-quantity is equal to, or smaller than, the reference electricity-quantity, then decides that an internal short is not generated and rewrites the reference electricity-quantity stored in the electricity-quantity storage circuit into the accumulative electricity-quantity.

2. The secondary-battery internal short detection apparatus according to claim 1, wherein if the accumulative electricity-quantity is larger, by 3 percent or over, than the reference electricity-quantity, then the internal short detection circuit decides that an internal short is generated.

3. The secondary-battery internal short detection apparatus according to claim 1, wherein the internal short detection circuit: compares, for each charge and discharge cycle, the accumulative electricity-quantity measured by the electricity-quantity accumulation circuit and the reference electricity-quantity stored in the electricity-quantity storage circuit; if the accumulative electricity-quantity is larger than the reference electricity-quantity, then decides that an internal short is generated; and if the accumulative electricity-quantity is equal to, or smaller than, the reference electricity-quantity, then decides that an internal short is not generated and rewrites the reference electricity-quantity stored in the electricity-quantity storage circuit into the accumulative electricity-quantity.

4. The secondary-battery internal short detection apparatus according to claim 1, wherein only if the accumulative electricity-quantity continues to be larger, a plurality of times, than the reference electricity-quantity, then the internal short detection circuit decides that an internal short is generated.

5. The secondary-battery internal short detection apparatus according to claim 1, wherein:

the electricity-quantity storage circuit stores the reference electricity-quantity at the number of a plurality of times; and the internal short detection circuit: compares the accumulative electricity-quantity measured by the electricity-quantity accumulation circuit and the reference electricity-quantity at the number of the plurality of times stored in the electricity-quantity storage circuit; and only if the accumulative electricity-quantity is larger than the reference electricity-quantity all the plurality of times, then decides that an internal short is generated.

6. A secondary-battery internal short detection method for detecting an internal short in a secondary-battery, comprising:

an electricity-quantity accumulating step of measuring an accumulative electricity-quantity necessary for charging the secondary-battery from a first voltage to a second voltage higher than the first voltage;

an electricity-quantity comparing step of comparing the accumulative electricity-quantity measured in the electricity-quantity accumulating step and a reference electricity-quantity which is stored in advance in an electricity-quantity storage circuit and is necessary for charging the secondary-battery from the first voltage to the second voltage;

an internal short detecting step of deciding that an internal short is generated, if the accumulative electricity-quantity is larger than the reference electricity-quantity in the electricity-quantity comparing step; and a reference electricity-quantity rewriting step of deciding that an internal short is not generated and rewriting the reference electricity-quantity stored in the electricity-quantity storage circuit into the accumulative electricity-quantity, if the accumulative electricity-quantity is equal to, or smaller than, the reference electricity-quantity in the electricity-quantity comparing step.

7. A battery-pack, comprising:
a secondary-battery;
a voltage detection circuit which detects a voltage up to which the secondary-battery is charged;
a current detection circuit which detects an electric current which passes through the secondary-battery;
the internal short detection apparatus according to claim 1;
a battery-pack switch which turns on and off the power supplied to the outside from the secondary-battery; and
a battery-pack switch control circuit which receives an internal short signal outputted when the internal short detection apparatus decides that an internal short is generated, and turns off the battery-pack switch.

8. Electronic equipment in which the battery-pack according to claim 7 is used as a power-source, comprising:
a battery charger which charges a secondary-battery provided in the battery-pack;
an alarming means; and
an alarm control circuit which receives a signal indicating an internal short which is outputted from the battery-pack, and allows the alarming means to warn that the internal short is generated.

9. The electronic equipment according to claim 8, further comprising:
a load section to which the power is supplied from the secondary-battery;
an electronic-equipment switch which turns on and off the power supplied to the load section from the secondary-battery; and
an electronic-equipment switch control circuit which receives a signal indicating an internal short which is outputted from the battery-pack, and turns off the electronic-equipment switch.

10. The electronic equipment according to claim 9, wherein:
the electronic-equipment switch control circuit receives an internal short signal indicating an internal short which is outputted from the battery-pack and a subtraction value left when the reference electricity-quantity is subtracted from the accumulative electricity-quantity, and turns off the electronic-equipment switch if the subtraction value is equal to, or more than, a predetermined value; and
the alarm control circuit receives the internal short signal and the subtraction value, and if the subtraction value is less than the predetermined value, allows the alarming means to warn that an internal short is generated.

11. Electronic equipment in which the battery-pack according to claim 7 is used as a power-source, comprising:
a battery charger which charges a secondary-battery provided in the battery-pack;
a load section to which the power is supplied from the secondary-battery;
an electronic-equipment switch which turns on and off the power supplied to the load section from the secondary-battery; and
an electronic-equipment switch control circuit which receives a signal indicating an internal short which is outputted from the battery-pack, and turns off the electronic-equipment switch.

* * * * *